United States Patent
Kwon et al.

(10) Patent No.: US 7,230,853 B2
(45) Date of Patent: Jun. 12, 2007

(54) SELECTIVE ERASE METHOD FOR FLASH MEMORY

(75) Inventors: Wook-Hyun Kwon, Gyeonggi-do (KR); Jung-In Han, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 52 days.

(21) Appl. No.: 10/960,542

(22) Filed: Oct. 7, 2004

(65) Prior Publication Data

US 2006/0018163 A1    Jan. 26, 2006

(30) Foreign Application Priority Data

Jul. 21, 2004   (KR) .................... 10-2004-0056902

(51) Int. Cl.
*G11C 16/06* (2006.01)
(52) U.S. Cl. .................... 365/185.22; 365/185.29; 365/185.3; 365/185.18
(58) Field of Classification Search ........... 365/185.22, 365/185.29, 185.3, 185.18
See application file for complete search history.

(56) References Cited

U.S. PATENT DOCUMENTS

| | | | | |
|---|---|---|---|---|
| 5,600,593 A | * | 2/1997 | Fong | 365/185.33 |
| 5,831,905 A | | 11/1998 | Hirano | |
| 5,995,418 A | * | 11/1999 | Chen et al. | 365/185.29 |
| 6,314,027 B1 | * | 11/2001 | Choi | 365/185.29 |
| 6,836,435 B2 | * | 12/2004 | Li | 365/185.22 |

FOREIGN PATENT DOCUMENTS

| | | |
|---|---|---|
| JP | 09-320282 | 12/1997 |
| JP | 2001-283595 | 10/2001 |
| KR | 000036391 | 7/2000 |
| KR | 000038225 | 7/2000 |
| KR | 20010098374 | 11/2001 |

OTHER PUBLICATIONS

Notice to Submit a Response for Korean Patent Apllication No. 10-2004-0056902 mailed on Mar. 7, 2006.

* cited by examiner

*Primary Examiner*—Huan Hoang
(74) *Attorney, Agent, or Firm*—Myers Bigel Sibley & Sajovec

(57) ABSTRACT

Selective erase method for a flash memory device including a group of memory cells arranged in rows and columns include performing an erase operation on the group of memory cells and verifying the erase operation on the group of memory cells to determine threshold voltages of the memory cells. At least one row of memory cells including memory cells having a threshold voltage lower than a desired erase threshold voltage is identified. A further erase operation is performed on the group of memory cells excluding memory cells of the at least one row of memory cells including memory cells having a threshold voltage lower than a desired erase threshold voltage.

21 Claims, 3 Drawing Sheets

SELECTIVE ERASE METHOD FOR FLASH MEMORY

CROSS-REFERENCE TO RELATED APPLICATION

This application is related to and claims priority from Korean Patent Application No. 2004-56902, filed on Jul. 21, 2004, the disclosure of which is hereby incorporated herein by reference in its entirety.

BACKGROUND OF THE INVENTION

The present invention relates to integrated circuit devices and, more particularly, to flash memory devices and programming methods thereof.

Non-volatile memory devices are generally capable of storing data even when no power is supplied. One type of non-volatile memory device is a flash memory. Flash memories typically operate by electrically erasing data in a plurality of cells at the same time. Flash memories have been widely used in the field of computers and memory cards in recent years.

FIG. 1 is a cross-sectional view illustrating a conventional NOR-type flash memory cell 10. As shown in FIG. 1, an electrically programmable and erasable NOR-type flash memory cell 10 includes N-type source and drain regions 13 and 14, insulating layers 15 and 17, a floating gate 16, a control gate 18 and a P-type semiconductor substrate (bulk) 19. The source and drain regions 13 and 14 are shown formed on the semiconductor substrate 19. The floating gate 16 is shown formed adjacent a channel region of the source and drain regions 13 and 14 on a thin insulating layer 15 having approximately 100 Angrstrom (Å) thickness. The control gate 18 is formed on an upper portion of the floating gate 16 with the insulating layer 17 therebetween. The control gate 18 is connected to a word line of a NOR-type flash memory device including the cell 10.

While only a single cell is illustrated in FIG. 1, it will be understood that a cell array of the NOR-type flash memory devices is generally arranged in rows (selectable by word lines) and columns (selectable by bit lines) and may include a plurality of banks, each having a row and column arrangement of cells. Each of the banks may include a plurality of sectors and each sector may include a plurality of memory cells. Typically, an erase operation of the NOR-type flash memory is performed a sector at a time. The sector may include 1024 word lines. A program operation is typically performed a word line at a time (or by byte unit).

Flash memory cells within a sector are generally erased concurrently by F-N tunneling (Fowler-Nordheim tunneling). In F-N tunneling, a negative high voltage, for example, about −10 volts (V), is typically applied to the control gate 18, and a positive voltage of, for example, 5 to 10V, suitable to generate the F-N tunneling, is applied to the semiconductor substrate 19. At this time, the source and drain regions 13 and 14 are maintained in a floating state. An erase operation under this bias condition may be referred to as a Negative Gate and Bulk Erase (NGBE). Under this bias condition, an electric field of about 6 to 7 millivolts/centimer (MV/cm) is typically formed between the control gate 18 and the semiconductor substrate 19 to generate F-N tunneling. As a result, negative charges that accumulate on the floating gate 16 are discharged to the source region 13 through the insulating layer 15, and the threshold voltage of the flash memory cell 10 becomes low.

FIG. 2 is a flowchart showing a conventional erase operation of a NOR-type flash memory. As shown in FIG. 2, the erase operation of the NOR-type flash memory includes: performing a pre-program and verification (block 110); performing a main erase by sector unit and verification of the same (block 120); and, performing a post-program operation with verification (block 160).

At block 110, in order to prevent or limit a memory cell from being over-erased during the main erase operation, the pre-program may be performed by applying the same bias as a normal program operation to the memory cell. After performing the pre-program, the verification of the pre-program may be performed. If the state of a selected memory cell is not a program state, a program operation may be repeatedly performed until the selected memory cell reaches the program state.

At block 120, a main erase operation may be continuously performed to set all the memory cells within a sector unit to the same erase state, such as an "on" state. After performing the erasing operation, the verification operation to verify that all cells have been erased is typically performed. If the state of a selected one of the memory cells is determined not to be in the erase state during verification, an erase operation is typically performed again until the selected memory cell is set to the erase state.

As a result of the repeated erase operations due to individual memory cells not being initially set to the erase state while other cells have already reached the erase state, previously erased memory cells may be over-erased. The pre-program operation is typically performed as indicated at block 110. However, the post-program operation is performed at block 160 after the main erase is completed (i.e., all the cells in the sector unit verify as having been erased). This post program operation is generally performed after the main erase is completed as there may be over-erased memory cells (memory cells having a threshold voltage of a lower level than a target erase threshold voltage) after the main erase operation due to an erase speed difference of the respective memory cell.

To perform the post-program, a source and substrate of the over-erased memory cell are generally grounded. In addition, a voltage (e.g., 3V) lower than a program voltage (e.g., 10V) is typically applied to a control gate, and a voltage of about 5 to 6V is typically applied to a drain region. By applying this voltage bias condition, a small amount of negative charge, in comparison with the pre-program operation, is generally accumulated on the floating gate during the post-program operation. After performing the post-program operation, a verification of the post-program is generally performed as indicated at block 160. The verification process for the post-program operation may be performed in substantially the same manner as described with reference to the verification for the pre-program operation at block 110.

Using the erase method described with reference to FIG. 2, over-erased memory cells may generally be cured. However, it is, as a practical matter, essentially impossible to fundamentally prevent memory cells from being over-erased. This limitation generally arises because the erase and verify operations at block 120 are typically performed based on characteristics of a memory cell having the highest threshold voltage. In other words, according to a conventional erase method, an erase operation is typically performed repeatedly so that the threshold voltages of all memory cells drops to the maximum value of a distribution of threshold voltages for an erase state of a memory cell. During the repeated erase operations, a memory cell having fast erase speed (high coupling ratio (R)) is typically erased relatively faster than a memory cell having slow erase speed. A threshold voltage difference between a cell with a fast erase speed and a cell with the slowest erase speed is generally referred to as a distribution of erase threshold voltages within a sector unit. The distribution of erase threshold voltages generally increases in proportion to a difference of the erase speeds. If the distribution of erase threshold voltages is great, the erase threshold voltages of several cells may drop to less than 0V before the slowest cell is erased. Such cells are generally referred to called as over-erased cells. A cell having a threshold voltage of less than 0V should have its threshold voltage raised to more than 0V again by the post-program operation. However, with an increase in over-erased cells, excessive current may flow.

In addition, on occasion, attempts to raise a threshold voltage to more than 0V may fail. This phenomenon may be referred to as an over-erase problem. Accordingly, it may be beneficial to decrease the distribution of threshold voltages in an erase state in designing high-integration NOR-type flash memory devices.

SUMMARY OF THE INVENTION

Embodiments of the present invention include selective erase methods for a flash memory device including a group of memory cells arranged in rows and columns. An erase operation is performed on the group of memory cells. The erase operation on the group of memory cells is verified to determine threshold voltages of the memory cells. At least one row of memory cells including memory cells having a threshold voltage lower than a desired erase threshold voltage is identified. A further erase operation is performed on the group of memory cells excluding memory cells of the at least one row of memory cells including memory cells having a threshold voltage lower than a desired erase threshold voltage.

In other embodiments of the present invention, performing a further erase operation is followed by verifying the further erase operation. Performing a further erase operation and verifying the further erase operation are repeated until all memory cells of the group of memory cells have threshold voltages lower than the desired erase threshold voltage. Performing a further erase operation may include floating memory cells of the at least one row of memory cells during the further erase operation. In other embodiments of the present invention, performing a further erase operation includes applying a positive voltage exceeding a selected level to control gates and bulks of the memory cells of the at least one row of memory cells during the further erase operation. In yet further embodiments of the present invention, performing a further erase operation includes applying a negative voltage exceeding a selected level to control gates and bulks of the memory cells of the at least one row of memory cells during the further erase operation. In yet other embodiments of the present invention, performing a further erase operation includes applying a negative voltage exceeding a selected level to control gates of the memory cells of the at least one row of memory cells and a high voltage exceeding a selected level to sources of the memory cells of the at least one row of memory cells during the further erase operation. Performing a further erase operation in further embodiments includes grounding control gates of the memory cells in the at least one row of memory cells during the further erase operation.

In other embodiments of the present invention, performing a further erase operation includes applying a negative voltage exceeding a selected level to control gates of the memory cells to be re-erased during the further erase operation and a positive voltage exceeding a selected level to bulks of the memory cells to be re-erased during the further erase operation during the further erase operation. Performing an erase operation may be preceded by pre-programming the group of memory cells. Repeating performing the further erase operation may be followed by post-programming the group of memory cells.

In further embodiments of the present invention, the rows are associated in a plurality of sub-groups of rows. Identifying at least one row of memory cells in such embodiments includes identifying at least one sub-group of rows of memory cells including memory cells having a threshold voltage lower than a desired erase threshold voltage and performing a further erase operation includes performing a further erase operation on the group of memory cells excluding memory cells of the at least one sub-group of rows of memory cells including memory cells having a threshold voltage lower than a desired erase threshold voltage.

In other embodiments of the present invention, selective erase methods for a flash memory device including a group of memory cells arranged in rows and columns include erasing the group of memory cells and determining if threshold voltages of the erased memory cells satisfy a desired erase threshold voltage criterion. Rows of memory cells including at least one memory cell having an associated threshold voltage that fails to satisfy the desired threshold voltage criterion are identified. Memory cells in identified rows of memory cells including at least one memory cell having an associated threshold voltage that fails to satisfy the desired threshold voltage criterion are re-erased without re-erasing memory cells in rows of memory cells not including any memory cell having an associated threshold voltage that fails to satisfy the desired threshold voltage criterion. Identifying rows and re-erasing memory cells operations are repeated until all memory cells in the group of memory cells have an associated threshold voltage that satisfies the desired threshold voltage criterion.

Re-erasing the memory cells may include, while re-erasing memory cells, floating memory cells that are not re-erased. Re-erasing the memory cells may include, while re-erasing memory cells, applying a positive voltage exceeding a selected level to control gates and bulks of memory cells that are not re-erased. Re-erasing memory cells in other embodiments includes, while re-erasing memory cells, applying a negative voltage exceeding a selected level to control gates of memory cells that are not re-erased. In yet other embodiments of the present invention, re-erasing memory cells includes, while re-erasing memory cells, applying a negative voltage exceeding a selected level to control gates of memory cells that are not re-erased and a positive voltage exceeding a selected level to sources of the memory cells that are not re-erased. In further embodiments of the present invention, re-erasing memory cells includes, while re-erasing memory cells, floating control gates of memory cells that are not re-erased. In yet further embodiments, re-erasing memory cells includes, while re-erasing memory cells, applying a negative voltage exceeding a selected level to control gates of memory cells to be erased and a positive voltage exceeding a selected level to bulks of the memory cells to be erased.

Erasing the group of memory cells may be preceded by pre-programming the group of memory cells. Repeating identifying rows and re-erasing memory cells may be followed by post-programming the group of memory cells.

BRIEF DESCRIPTION OF THE DRAWINGS

The present invention will now be described with reference exemplary embodiments illustrated in the attached drawings in which.

DETAILED DESCRIPTION OF THE INVENTION

Figure 1:
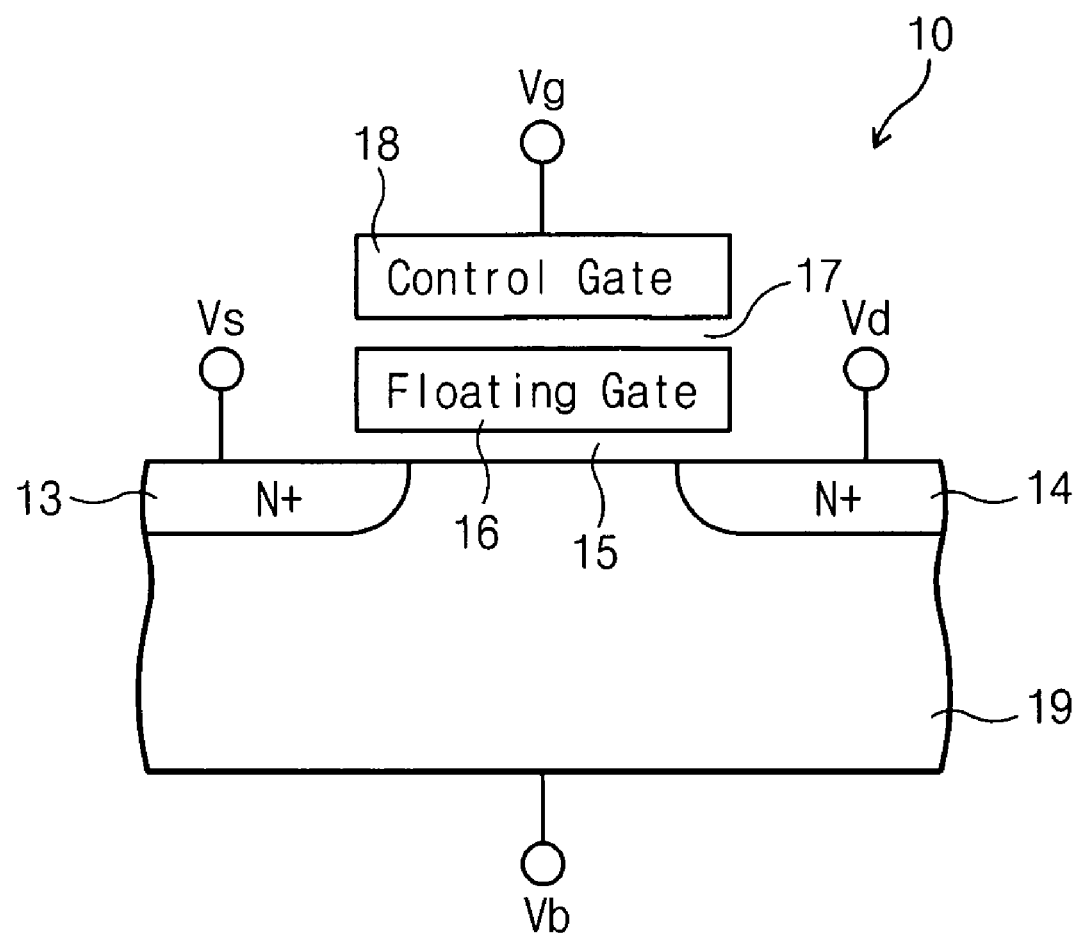
FIG. 1 is a cross-sectional diagram illustrating a conventional NOR-type flash memory device.
Figure 2:
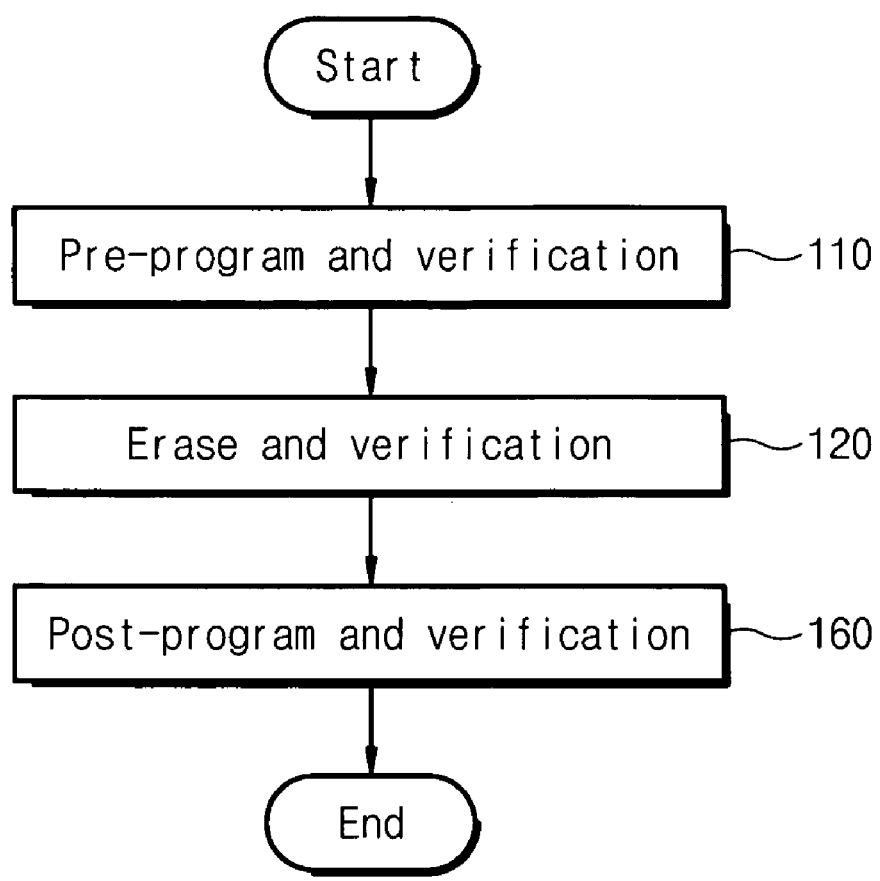
FIG. 2 is a flowchart illustrating a conventional erase method for a NOR-type flash memory device.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Selective erase methods for a flash memory device according to some embodiments of the present invention include an erase operation for flash memory cells that performed excluding one or more word lines associated with flash memory cells having threshold voltages lower than a desired erase threshold voltage. This selective erase operation may be performed repeatedly until threshold voltages of memory cells of all word lines become lower than the desired erase threshold voltage.

Figure 3:
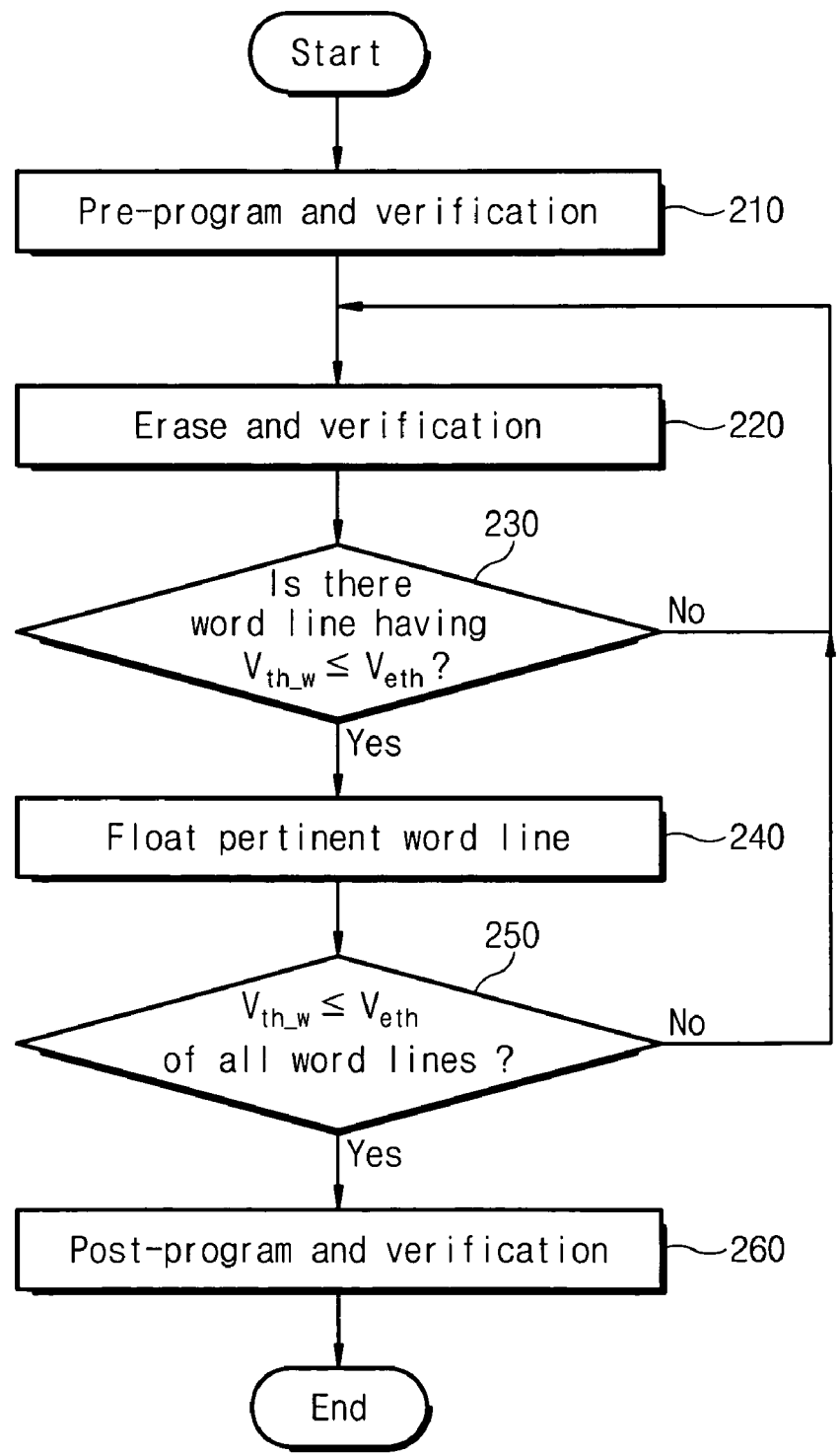
FIG. 3 is a flowchart illustrating selective erase methods of a NOR-type flash memory device according to some embodiments of the present invention.

FIG. 3 is a flowchart illustrating selective erase methods for a NOR-type flash memory device according to some embodiments of the present invention. For the embodiments illustrated in FIG. 3, all memory cells to be erased in a sector region are pre-programmed and then a verification operation is performed for the pre-programmed cells (block 210). Based on the results of the verification operation at block 210, if an abnormal pre-program result is detected, a program operation may be repeatedly performed until a normal pre-program result is detected. Memory cells included in the sector region are then erased and the erase operation is verified with a verification operation (block 220). The sector region being operated on includes a plurality of word lines connected to a plurality of memory cells in the sector region.

After performing the erase and verification of the erase at block 220, operations continue by determining, based on the results of the verification operation at block 220, whether a word line (associated with a row of memory cells in the sector region) includes memory cells having lower threshold voltages $V_{th\_w}$ than a desired threshold voltage $V_{eth}$ (block 230). If it is determined that there is a word line having memory cells with threshold voltages $V_{th\_w}$ under the desired threshold voltage $V_{eth}$ (block 230), the word line so detected is floated (block 240).

It is also determined whether threshold voltages $V_{th\_w}$ of memory cells of all of the word lines drop below the desired erase threshold voltage $V_{eth}$ (block 250). If the threshold voltages $V_{th\_w}$ of memory cells of all word lines do not drop below the desired erase threshold voltage $V_{eth}$ (block 250), operations return to block 220 and memory cells in the sector region, excluding a specific word line being floated, are erased. This selective erase operation may be performed repeatedly until the threshold voltages $V_{th\_w}$ of memory cells of all the word lines drop under the desired erase threshold voltage $V_{eth}$. If none of the word lines have memory cells with threshold voltages $V_{th\_w}$ under the desired threshold voltage $V_{eth}$ (block 230), operations may return to block 220 to repeat the erase operation without floating any word line.

The selective erase operation may be performed by individual word line unit, as generally described above, or may be performed by grouping a plurality of word lines. For example, on the basis of one word line as well as N–1 successive word lines (e.g., 8 to 16 word lines), an erase operation with respect to memory cells of the rest of the memory cells in the sector region associated with other word lines, excluding the N grouped word lines, may be performed by determining whether threshold voltages $V_{th\_w}$ of memory cells corresponding to the N grouped word lines drop below the desired erase threshold voltage $V_{eth}$. This approach may be applicable to various types of groupings responsive to a mode for switching a word line used by the memory device logic.

Referring again to the embodiments illustrated in FIG. 3, after performing selective erase operations, a post-program operation is performed (block 260). The post-program operation may use a lower electric potential than the pre-program operation at block 210. A verification operation for the post-program operation is also performed (block 260). The post-program verification process may operate substantially as described above for the verification of the pre-program operation of block 210.

In theory, all erase processes are ended by performance of the post-program operation at block 260. However, in some embodiments of the present invention, the selective erase operations may make the post-program and the pre-program of blocks 260 and 210 unneccesary by providing an improved distribution of erase threshold voltages. The need for the post-program and pre-program operations generally results from repetitive test results about the distribution of erase threshold voltages.

As described above, FIG. 3 illustrates methods for floating selected word lines according to some embodiments of the present invention, which may limit or prevent repeated erasing of a specific word line during an erase operation. However, other embodiments of the present invention provide different approaches to performing a selective erase. In order to prevent or limit erasing of specific word lines during repeated erase operations, rather than floating the word line as described with reference to FIG. 3, a specific voltage (e.g., a positive high voltage, a negative high voltage, or a ground voltage of 0V) may be applied to a selected word line (i.e., to a control gate of memory cells connected to the word line), or a specific voltage (e.g., a positive high voltage or a ground voltage of 0V) may be applied to bulks or sources of memory cells connected with the word line to selectively control erasing operations on memory cells associated with the selected word line(s). A voltage supplying method for performing such a selective erase operation will now be described for various illustrative embodiments of the present invention with reference to Table 1.

voltage of 0V applied to the selected word line(s) as indicated in column 6 of Table 1 (fifth embodiment). Note that, in Table 1, when a condition may take various states (i.e., "don't care data") it is so denoted by "-" as the state of such a line need not to be considered herein. For example, the don't care data may be satisfied by applying or floating a voltage defined in column 2 or a voltage of 0V. As will be understood by those of skill in the art, the voltage application embodiments illustrated in Table 1 may be modified in various manners to provide for selective erase of particular word line associated memory cells.

For various embodiments of the present invention, selective erase operations for flash memory cells, if threshold voltages of memory cells connected to an erased word line are lower than a desired erase threshold voltage, the memory cells coupled to the word line may be selected so as not to be re-erased during the erase operation for the flash memory cells. This selective erase operation may be performed repeatedly until threshold voltages of memory cells connected to all word lines of a memory device or sector unit of a memory device being erased become lower than the desired erase threshold voltage.

As a result, the occurrence of over-erased memory cells that may be caused by an erase speed difference between memory cells may be reduced or even prevented. In addition, a distribution of erase threshold voltages in the device may be improved. Furthermore, the need for a pre-program operation and/or a post-program operation may be avoided and current consumption in an erase operation may be reduced as a result of the improved distribution of erase threshold voltages.

The foregoing is illustrative of the present invention and is not to be construed as limiting thereof. Although a few exemplary embodiments of this invention have been described, those skilled in the art will readily appreciate that

TABLE 1

| A voltage supplying for selective erase | The first embodiment | The second embodiment | The third embodiment | The fourth embodiment | The fifth embodiment |
| --- | --- | --- | --- | --- | --- |
| Word line to be erased | −10 V | — | — | — | — |
| Word line not to be erased | Floating | 6~8 V | −10 V | −10 V | 0 V |
| Source | Floating | — | — | 6~8 V | — |
| Bulk | 6~8 V | — | — | — | — |

Referring to Table 1, in accordance with selective erase methods according to various embodiments of the present invention, column 2 (first embodiment) of Table 1 illustrates that a selected word line(s) may be floated as described for the embodiments of FIG. 3 for word line(s) with memory cells having lower threshold voltages $V_{th\_w}$ than a desired threshold voltage $V_{eth}$. As indicated in column 3 of Table 1 (second embodiment), for memory cells connected to a selected word line that is not to be erased, the same high voltages (6 to 8V) as applied to the bulks of the memory cells may be applied to the selected word line(s) instead. As indicated in column 4 of Table 1 (third embodiment), for memory cells connected to the selected word line that is not to be erased, a negative high voltage (−10V) may be applied to the selected word line(s) or a negative high voltage (−10V) may be applied to the selected word line and a positive high voltage (6 to 8V) may be applied to sources of memory cells as indicated in column 5 of Table 1 (fourth embodiment). Furthermore, memory cells connected to the selected word line(s) not to be erased may have a ground many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A selective erase method for a flash memory device including a group of memory cells arranged in rows and columns, the method comprising:

performing a Negative Gate and Bulk Erase (NGBE) operation on the group of memory cells by applying an electric field between control gates and a substrate of the flash memory device;

verifying the erase operation on the group of memory cells to determine threshold voltages of the memory cells;

identifying at least one row of memory cells including memory cells having a threshold voltage lower than a desired erase threshold voltage;

performing a further Negative Gate and Bulk Erase (NGBE) operation on the group of memory cells excluding memory cells of the at least one row of memory cells including memory cells having a threshold voltage lower than a desired erase threshold voltage;

verifying the further erase operation; and repeating performing a further erase operation and verifying the further erase operation until all memory cells of the group of memory cells have threshold voltages lower than the desired erase threshold voltage; and wherein performing the further erase operation includes at least one of the following:

applying a positive voltage exceeding a selected level to control gates and bulks of the memory cells of the at least one row of memory cells during the further erase operation;

applying a negative voltage exceeding a selected level to control gates and bulks of the memory cells of the at least one row of memory cells during the further erase operation;

applying a negative voltage exceeding a selected level to control gates of the memory cells of the at least one row of memory cells and a high voltage exceeding a selected level to sources of the memory cells of the at least one row of memory cells during the further erase operation; or applying a negative voltage exceeding a selected level to control gates of the memory cells to be re-erased during the further erase operation and a positive voltage exceeding a selected level to bulks of the memory cells to be re-erased during the further erase operation during the further erase operation.

2. The method of claim 1, wherein performing the further erase operation includes floating memory cells of the at least one row of memory cells during the further erase operation.

3. The method of claim 1, wherein performing a further erase operation includes applying a positive voltage exceeding a selected level to control gates and bulks of the memory cells of the at least one row of memory cells during the further erase operation.

4. The method of claim 1, wherein performing a further erase operation includes applying a negative voltage exceeding a selected level to control gates and bulks of the memory cells of the at least one row of memory cells during the further erase operation.

5. The method of claim 1, wherein performing a further erase operation includes applying a negative voltage exceeding a selected level to control gates of the memory cells of the at least one row of memory cells and a high voltage exceeding a selected level to sources of the memory cells of the at least one row of memory cells during the further erase operation.

6. The method of claim 1, wherein performing a further erase operation includes grounding control gates of the memory cells in the at least one row of memory cells during the further erase operation.

7. The method of claim 1, wherein performing the further erase operation includes applying a negative voltage exceeding a selected level to control gates of the memory cells to be re-erased during the further erase operation and a positive voltage exceeding a selected level to bulks of the memory cells to be re-erased during the further erase operation during the further erase operation.

8. A selective erase method for a flash memory device including a group of memory cells arranged in rows and columns, the method comprising:

performing a Negative Gate and Bulk Erase (NGBE) operation on the group of memory cells by applying an electric field between control gates and a substrate of the flash memory device;

verifying the erase operation on the group of memory cells to determine threshold voltages of the memory cells;

identifying at least one row of memory cells including memory cells having a threshold voltage lower than a desired erase threshold voltage;

performing a further Negative Gate and Bulk Erase (NGBE) operation on the group of memory cells excluding memory cells of the at least one row of memory cells including memory cells having a threshold voltage lower than a desired erase threshold voltage;

verifying the further erase operation; and repeating performing a further erase operation and verifying the further erase operation until all memory cells of the group of memory cells have threshold voltages lower than the desired erase threshold voltage;

wherein the rows are associated in a plurality of subgroups of rows and wherein identifying at least one row of memory cells including memory cells having a threshold voltage lower than a desired erase threshold voltage comprises identifying at least one sub-group of rows of memory cells including memory cells having a threshold voltage lower than a desired erase threshold voltage and wherein performing a further erase operation on the group of memory cells excluding memory cells of the at least one row of memory cells including memory cells having a threshold voltage lower than a desired erase threshold voltage comprises performing a further erase operation on the group of memory cells excluding memory cells of the at least one sub-group of rows of memory cells including memory cells having a threshold voltage lower than a desired erase threshold voltage.

9. The method of claim 1, wherein performing the erase operation is preceded by pre-programming the group of memory cells.

10. The method of claim 1, wherein repeating performing the further erase operation is followed by post-programming the group of memory cells.

11. A selective erase method for a flash memory device including a group of memory cells arranged in rows and columns, the method comprising:

performing a Negative Gate and Bulk Erase (NGBE) operation on the group of memory cells by applying an electric field between control gates and a substrate of the flash memory device;

determining if threshold voltages of the erased memory cells satisfy a desired erase threshold voltage criterion;

identifying rows of memory cells including at least one memory cell having an associated threshold voltage that fails to satisfy the desired threshold voltage criterion; and re-erasing memory cells in identified rows of memory cells including at least one memory cell having an associated threshold voltage that fails to satisfy the desired threshold voltage criterion by performing a Negative Gate and Bulk Erase (NGBE) operation without re-erasing memory cells in rows of memory cells not including any memory cell having an associated threshold voltage that fails to satisfy the desired threshold voltage criterion; and repeating identifying rows and re-erasing memory cells until all memory cells in the group of memory cells have an associated threshold voltage that satisfies the desired threshold voltage criterion and wherein re-erasing the memory cells includes at least one of the following:

while re-erasing memory cells, applying a positive voltage exceeding a selected level to control gates and bulks of memory cells that are not re-erased;

while re-erasing memory cells, applying a negative voltage exceeding a selected level to control gates of memory cells that are not re-erased;

while re-erasing memory cells, applying a negative voltage exceeding a selected level to control gates of memory cells that are not re-erased and a positive voltage exceeding a selected level to sources of the memory cells that are not re-erased;

while re-erasing memory cells, floating control gates of memory cells that are not re-erased;

while re-erasing memory cells, applying a negative voltage exceeding a selected level to control gates of memory cells to be erased and a positive voltage exceeding a selected level to bulks of the memory cells to be erased.

12. The method of claim 11, wherein re-erasing the memory cells includes, while re-erasing memory cells, floating memory cells that are not re-erased.

13. The method of claim 11, wherein re-erasing the memory cells includes, while re-erasing memory cells, applying a positive voltage exceeding a selected level to control gates and bulks of memory cells that are not re-erased.

14. The method of claim 11, wherein re-erasing memory cells includes, while re-erasing memory cells, applying a negative voltage exceeding a selected level to control gates of memory cells that are not re-erased.

15. The method of claim 11, wherein re-erasing memory cells includes, while re-erasing memory cells, applying a negative voltage exceeding a selected level to control gates of memory cells that are not re-erased and a positive voltage exceeding a selected level to sources of the memory cells that are not re-erased.

16. The method of claim 11, wherein re-erasing memory cells includes, while re-erasing memory cells, floating control gates of memory cells that are not re-erased.

17. The method of claim 11, re-erasing memory cells includes, while re-erasing memory cells, applying a negative voltage exceeding a selected level to control gates of memory cells to be erased and a positive voltage exceeding a selected level to bulks of the memory cells to be erased.

18. The method of claim 11, wherein erasing the group of memory cells is preceded by pre-programming the group of memory cells.

19. The method of claim 11, wherein repeating identifying rows and re-erasing memory cells is followed by post-programming the group of memory cells.

20. A selective erase method for a flash memory device including a group of memory cells arranged in rows and columns, the method comprising:

erasing the group of memory cells;

determining if threshold voltages of the erased memory cells satisfy a desired erase threshold voltage criterion;

identifying rows of memory cells including at least one memory cell having an associated threshold voltage that fails to satisfy the desired threshold voltage criterion; and re-erasing memory cells in identified rows of memory cells including at least one memory cell having an associated threshold voltage that fails to satisfy the desired threshold voltage criterion without re-erasing memory cells in rows of memory cells not including any memory cell having an associated threshold voltage that fails to satisfy the desired threshold voltage criterion;

repeating identifying rows and re-erasing memory cells until all memory cells in the group of memory cells have an associated threshold voltage that satisfies the desired threshold voltage criterion; and further comprising at least one of the following:

wherein re-erasing the memory cells includes, while re-erasing memory cells, applying a positive voltage exceeding a selected level to control gates and bulks of memory cells that are not re-erased;

wherein re-erasing memory cells includes, while re-erasing memory cells, applying a negative voltage exceeding a selected level to control gates of memory cells that are not re-erased;

wherein re-erasing memory cells includes, while re-erasing memory cells, applying a negative voltage exceeding a selected level to control gates of memory cells that are not re-erased and a positive voltage exceeding a selected level to sources of the memory cells that are not re-erased;

wherein re-erasing memory cells includes, while re-erasing memory cells, floating control gates of memory cells that are not re-erased; and wherein re-erasing memory cells includes, while re-erasing memory cells, applying a negative voltage exceeding a selected level to control gates of memory cells to be erased and a positive voltage exceeding a selected level to bulks of the memory cells to be erased.

21. A selective erase method for a flash memory device including a group of memory cells arranged in rows and columns, the method comprising:

performing an erase operation on the group of memory cells;

verifying the erase operation on the group of memory cells to determine threshold voltages of the memory cells;

identifying at least one row of memory cells including memory cells having a threshold voltage lower than a desired erase threshold voltage;

performing a further erase operation on the group of memory cells excluding memory cells of the at least one row of memory cells including memory cells having a threshold voltage lower than a desired erase threshold voltage;

verifying the further erase operation;

repeating performing a further erase operation and verifying the further erase operation until all memory cells of the group of memory cells have threshold voltages lower than the desired erase threshold voltage; and further comprising at least one of the following:

wherein performing the further erase operation includes applying a positive voltage exceeding a selected level to control gates and bulks of the memory cells of the at least one row of memory cells during the further erase operation;

wherein performing the further erase operation includes applying a negative voltage exceeding a selected level to control gates and bulks of the memory cells of the at least one row of the memory cells during the further erase operation;

wherein performing the further erase operation includes applying a negative voltage exceeding a selected level to control gates of the memory cells of the at least one row of memory cells and a high voltage exceeding a selected level to sources of the memory cells of the at least one row of memory cells during the further erase operation;

wherein performing the further erase operation includes applying a negative voltage exceeding a selected level to control gates of the memory cells to be re-erased during the further erase operation and a positive voltage exceeding a selected level to bulks of the memory cells to be re-erased during the further erase operation during the further erase operation; and wherein the rows are associated in a plurality of sub-groups of rows and wherein identifying at least one row of memory cells including memory cells having a threshold voltage lower than a desired erase threshold voltage comprises identifying at least one sub-group of rows of memory cells including memory cells having a threshold voltage lower than a desired erase threshold voltage and wherein performing a further erase operation on the group of memory cells including memory cells of the at least one row of memory cells including memory cells having a threshold voltage lower than a desired erase threshold voltage comprises performing a further erase operation on the group of memory cells excluding memory cells of the at least one sub-group of rows of memory cells including memory cells having a threshold voltage lower than a desired erase threshold voltage.

* * * * *